United States Patent
Barnes

(10) Patent No.: US 6,476,645 B1
(45) Date of Patent: Nov. 5, 2002

(54) METHOD AND APPARATUS FOR MITIGATING THE HISTORY EFFECT IN A SILICON-ON-INSULATOR (SOI)-BASED CIRCUIT

(75) Inventor: Philip L. Barnes, Plano, TX (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/927,673

(22) Filed: Aug. 10, 2001

(51) Int. Cl.[7] .......................... G11C 7/06; H03K 3/356
(52) U.S. Cl. ........................ 327/51; 327/54; 327/212
(58) Field of Search .............................. 327/51–57, 208, 327/210, 211, 212, 217

(56) References Cited

U.S. PATENT DOCUMENTS

| | | | | |
|---|---|---|---|---|
| 5,155,397 A | * | 10/1992 | Fassino et al. | 327/54 |
| 5,929,660 A | * | 7/1999 | Dillinger | 327/51 |
| 5,949,721 A | * | 9/1999 | Kwon et al. | 365/189.01 |
| 6,188,259 B1 | * | 2/2001 | Amir et al. | 327/217 |
| 6,424,195 B2 | * | 7/2002 | Samala | 327/212 |

* cited by examiner

Primary Examiner—Toan Tran

(57) ABSTRACT

A method and apparatus for mitigating the history effect in silicon-on-insulator (SOI)-based circuitry, e.g., data interface circuitry operable as a single-ended off-chip signal receiver in a VLSI component such as a microprocessor. A sense amplifier (sense amp) latch circuit arrangement includes a sense amp operable to sense data and a latch operable to hold the sensed data. When data is available, the sense amp generates a pair of complementary data signals responsive to a control signal used for alternating the sense amp's operation between an evaluation phase and an equilibration (i.e., pre-charge) phase. A feedback circuit portion is operable to modify the control signal's logic state within a clock phase associated with one of the two complementary clocks provided to the interface circuitry. Since the equilibration phase is entered combinationally off the evaluation phase, both evaluation and equilibration can be triggered from the same clock edge.

22 Claims, 4 Drawing Sheets

METHOD AND APPARATUS FOR MITIGATING THE HISTORY EFFECT IN A SILICON-ON-INSULATOR (SOI)-BASED CIRCUIT

BACKGROUND OF THE INVENTION

1. Technical Field of the Invention

The present invention generally relates to silicon-on-insulator (SOI)-based integrated circuits. More particularly, and not by way of any limitation, the present invention is directed to a method and apparatus for mitigating the "history effect" in an SOI-based sense amplifier latch circuit.

2. Description of Related Art

Several semiconductor manufacturers are exploring the possibility of utilizing silicon-on-insulator (SOI) process technology for advanced value-added products such as microprocessors. It is well known that at current 0.18 micron design rules and beyond, the SOI process offers significant advantages over bulk silicon processes widely in use today. Typically, SOI circuits can deliver a 20% performance gain by running at faster speeds because SOI effectively eliminates junction capacitance. Further, as noise margins are improved, signal sensitivity is also enhanced considerably in SOI-based circuitry.

SOI insulates transistors by building them on a silicon film atop a buried layer of oxide ($SiO_2$) across an entire wafer. Until recently it has been considered an attractive but difficult technology. Implanting a layer of oxide typically takes several hours on an expensive implantation machine, and bonding a silicon wafer with an insulating substrate is also quite costly. Further, SOI wafers can suffer from relatively frequent stress-induced defects in silicon, and from pinholes that occur in the buried oxide. Beyond the physical infrastructure, SOI is equally challenging to circuit designers. Drawing the much-vaunted performance gains from SOI requires new electronic design automation (EDA) tools, SOI-specific circuit models and retraining design teams.

An SOI device is insulated on all directions by oxide, on the right and left by shallow trench isolation and on the bottom by the buried-oxide layer in the SOI wafer. The active area of the transistor is a very small silicon volume that is said to "float" because it is not directly connected to anything. Accordingly, lacking an ohmic contact to ground, the potential floats between the top layer and the buried oxide. And with limited connections through source and drain, but no direct contact, the body voltage can change, giving rise to the floating-body or body bias effect, as well as a number of other issues, such as changes in the breakdown voltage, variable threshold voltages, etc. Further, SOI transistors exhibit what is known as the "history effect," where the body bias accumulates over time and deteriorates the device switching speed to unacceptable levels.

It should be appreciated by one skilled in the art that these negative "side effects" are particularly detrimental in high-speed data receiver circuitry typically employed in microprocessors, where sense amplifier and latch circuits are implemented for sensing data provided by off-chip input/output (I/O) circuitry. Current solutions that address these issues, such as implementing a separate body contact, are expensive and not entirely satisfactory.

SUMMARY OF THE INVENTION

Accordingly, the present invention advantageously provides a method and apparatus for mitigating the history effect in silicon-on-insulator (SOI)-based circuitry, e.g., data interface circuitry operable as a single-ended off-chip signal receiver in a VLSI component such as a microprocessor. In one aspect of the present invention, the exemplary data interface circuitry is comprised of a sense amplifier (sense amp) latch circuit arrangement which includes a sense amp operable to sense data and a latch operable to hold the sensed data. When data is available from an off-chip data I/O circuit, the sense amp generates a pair of complementary data signals responsive to a rising edge in the clock signal. A control signal is used for alternating the sense amp's operation between an evaluation phase and an equilibration (i.e., pre-charging) phase. A feedback circuit portion is included to effectuate a self-timed loop operable to modify the control signal's logic state within a clock phase associated with the clock signal provided to the interface circuitry. Since the equilibration phase is entered combinationally off the evaluation phase, both evaluation and equilibration can be triggered from the same clock edge. In a preferred exemplary embodiment, a pair of complementary clocks are provided such that two rising edges are available within a single clock cycle.

In another aspect, the present invention is directed to a data operation method involving the SOI-based circuitry. Responsive to a logic transition in a first clock, a data value is sensed by a sense amp in its evaluation phase. Thereafter, the evaluation phase is shut down so as to enter into an equilibration phase while the first clock is still in the transitioned state. Responsive to a logic transition in a second clock, a next data value is sensed by the sense amp. Subsequently, the sense amp's evaluation phase is shut down so that the equilibration phase starts while the second clock is still in the transitioned state. By reducing the time spent by the sense amp circuitry in the evaluation phase (wherein the circuitry is in an electrically imbalanced state), the mismatching of accumulated transistor body bias in the SOI devices used in the circuitry is advantageously reduced also.

In a presently preferred exemplary embodiment of the present invention, a pair of inverters provided in the data interface circuitry invert the complementary data signals generated by the sense amp during its evaluation phase. The feedback circuit portion includes an exclusive-OR (XOR) gate which receives the inverted data signals. A pair of zero catcher circuits are included for capturing a high-to-low transition that signifies a substantial completion of the sense amp's data sensing operation in a particular clock phase associated with one of the two complementary clocks. A multiplexer is provided for propagating a logic low state to the control signal when one of the zero catcher circuits generates a logic low in a particular clock phase so as to shut down the sense amp's evaluation phase.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
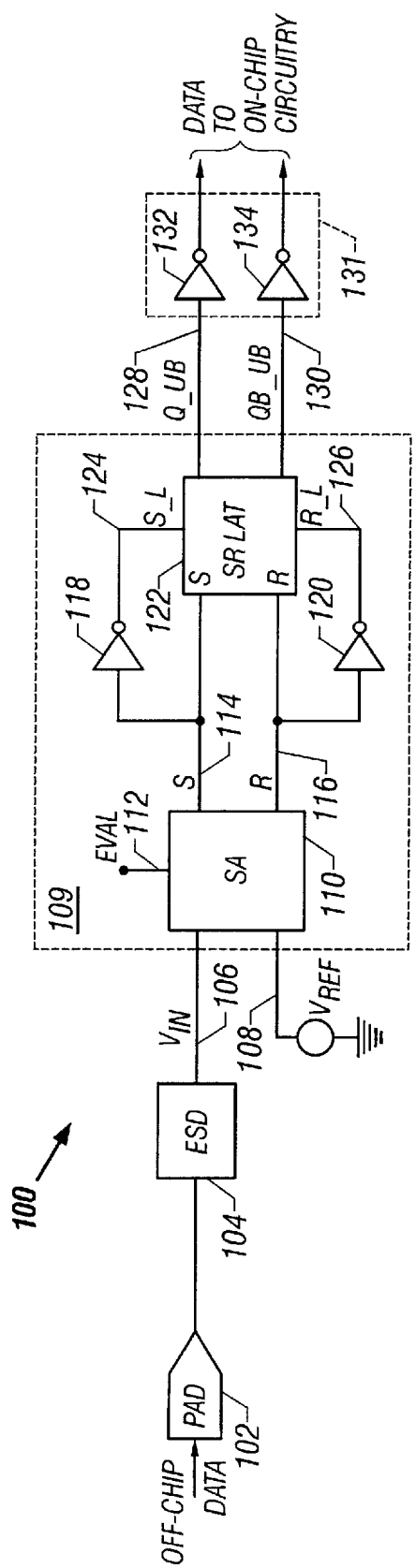
FIG. 1 depicts a functional schematic diagram of a presently preferred exemplary embodiment of an SOI-based data interface circuit having a sense amplifier (sense amp) latch arrangement wherein the history effect is mitigated in accordance with the teachings of the present invention.

In the drawings, like or similar elements are designated with identical reference numerals throughout the several views thereof, and the various elements depicted are not necessarily drawn to scale. Referring now to FIG. 1, depicted therein is a functional schematic diagram of a presently preferred exemplary embodiment of an SOI-based data interface circuit 100 having a sense amplifier latch (SAL) circuit portion 109, wherein the history effect is advantageously mitigated in accordance with the teachings of the present invention. Preferably, the data interface circuit 100 is operable as a single-ended, off-chip signal receiver disposed on a Very Large Scale Integration (VLSI) component such as, e.g., a microprocessor chip that is fabricated using an appropriate SOI design and process. Off-chip data input/output (I/O) circuitry (not shown) is operable to provide off-chip data signals (preferably implemented as open-drain data signals capable of a voltage swing of about ±400 mV) to a pad 102 associated with the interface circuit 100. An electrostatic discharge (ESD) protection block 104 may be included for providing appropriate ESD isolation to the data signals. The SAL circuit portion 109 is operable to receive the data signal as a VIN signal 106. A reference voltage, VREF, 108 is also provided as an input to the SAL circuit portion 109. As will be described in greater detail hereinbelow, a sense amp (SA) 110 included in the SAL circuit portion 109 is operable to sense the data based on the differential between VIN and VREF, responsive to a control signal 112 (hereinafter referred to as EVAL) that is used to alternate the sense amp's operation between an evaluation phase (where the data is sensed) and an equilibration phase (where the internal nodes of the sense amp are pre-charged to a balanced state). A pair of complementary data signals, S and R (reference numerals 114 and 116, respectively), are generated by the SA 110 which are provided to a set-reset (S-R) latch (SRLAT) 122 for latching the data. Inverter 118 and inverter 120 are operable to invert the data signals S and R, respectively, so as to generate inverted data signals, S_L 124 and R_L 126, which are also provided to SRLAT 122. Unbuffered data signals, Q_UB 128 and QB_UB 130, are generated by SRLAT 122 responsive to the complementary data signals 114,166 and the inverted signals 124,126 derived therefrom. A buffering stage 131 may be provided so as to buffer the levels of the data signals before they are propagated to appropriate on-chip circuitry for subsequent use. Preferably, the buffering stage 131 comprises inverters 132 and 134 for buffering Q_UB 128 and QB_UB 130, respectively.

Figure 2:
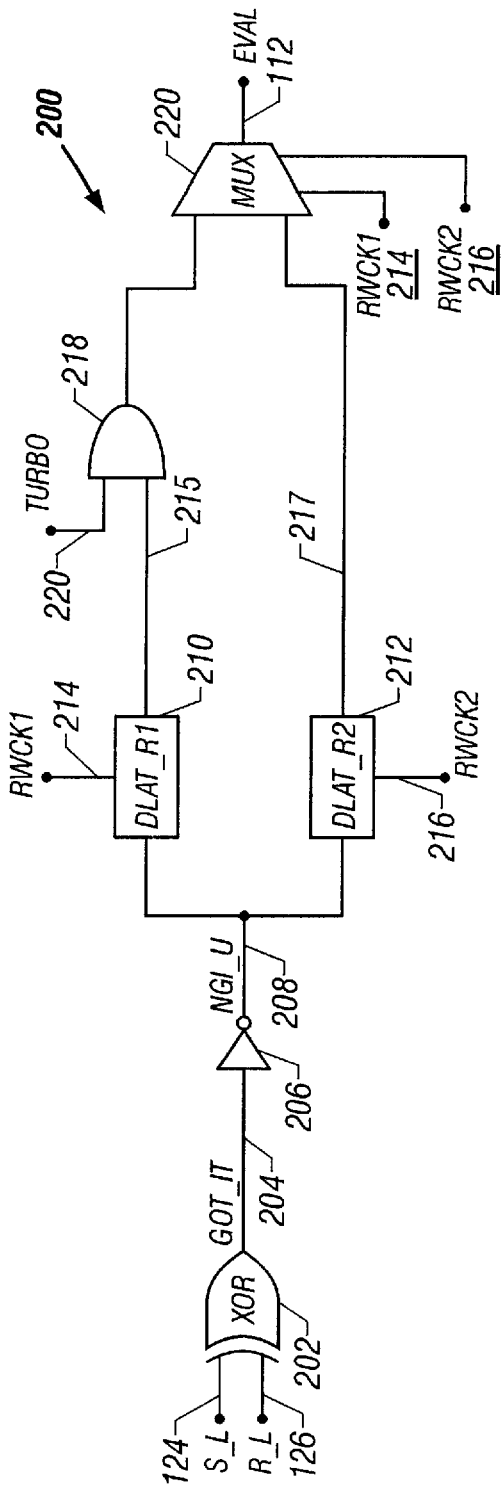
FIG. 2 depicts a functional schematic diagram of an exemplary feedback circuit provided in accordance with the teachings of the present invention for effectuating sense amp evaluation and equilibration phases from the same clock edge.

FIG. 2 depicts a functional schematic diagram of an exemplary feedback circuit 200 provided in accordance with the teachings of the present invention for mitigating the SOI history effect in the SAL circuit portion 109 by effectuating the sense amp evaluation and equilibration phases from the same clock edge. An exclusive-OR (XOR) gate 202 is operable to receive the inverted data signals S_L 124 and R_L 126 from the SAL circuit portion 109 and generate a GOT_IT signal 204 when the inputs are either [1,0] or [0,1]. An inverter 206 inverts the GOT_IT signal 204 to generate NGI_U signal 208, which is provided to two zero catcher circuits, DLAT_R1 210 and DLAT_R2 212, each of which is operable to capture a high-to-low transition that signifies substantial completion of a data sense operation by the sense amp within a particular clock phase of one of the two clocks providing timing to the interface circuitry. In FIG. 2, a first clock signal (RWCK1) 214 and a second clock signal (RWCK2) 216, which are preferably provided to be complementary, that is, out-of-phase, with respect to each other, are used to clock DLAT_R1 210 and DLAT_R2 212, respectively. As will be described in greater detail below, the zero catcher circuits operate to generate a logic low signal when a data sense operation in the evaluation phase of the sense amp is substantially complete, which logic low signal is thereafter propagated via a multiplexer (MUX) 220 to modify the logic state of the control signal 112. Reference numerals 215 and 217 refer to two signals, GOT_IT_C1 and GOT_IT C2, generated by the zero catcher circuits that are driven low depending on which of the clocks is in a logic high state, when NGI_U 208 is low. Thus, when one of the clocks is in phase (i.e., driven high) to start the evaluation phase of the SA, upon substantially completing the ensuing data sense operation, the EVAL control signal 112 will be driven low so that the evaluation phase is shut down and the equilibration phase is initiated while the clock is still high. In other words, the rising edge of the activated clock (RWCK1 or RWCK2) triggers the evaluation and, subsequently, the equilibration phase is entered combinationally off the evaluation phase by means of the self-timed loop effectuated by the feedback circuit portion 200. The same clock edge is operable, accordingly, to trigger both evaluation and equilibration phases of the SA operation. Further, since the clocks are complementary, there are two rising edges for one full clock cycle, giving rise to what may be referred to as the dual edge-triggered operation of the data interface circuitry.

In one exemplary embodiment, the effect of either of the zero catcher circuits, therefore either of the two complementary clocks, may be disabled by appropriate logic, whereby only a single edge-triggered operation may be effectuated. In the exemplary feedback circuit portion 200 shown in FIG. 2, an AND gate 218 is operable to AND the GOT_IT_C1 215 with a turbo signal 220, whose output is provided to the MUX 220. If the dual edge-triggered operation is not desired, accordingly, the turbo signal 220 is set to logic 0, thereby keeping the SA 110 in the equilibration phase throughout the RWCK1=logic 0, RWCK2=logic 1 phase of the clock cycle.

Figure 3:
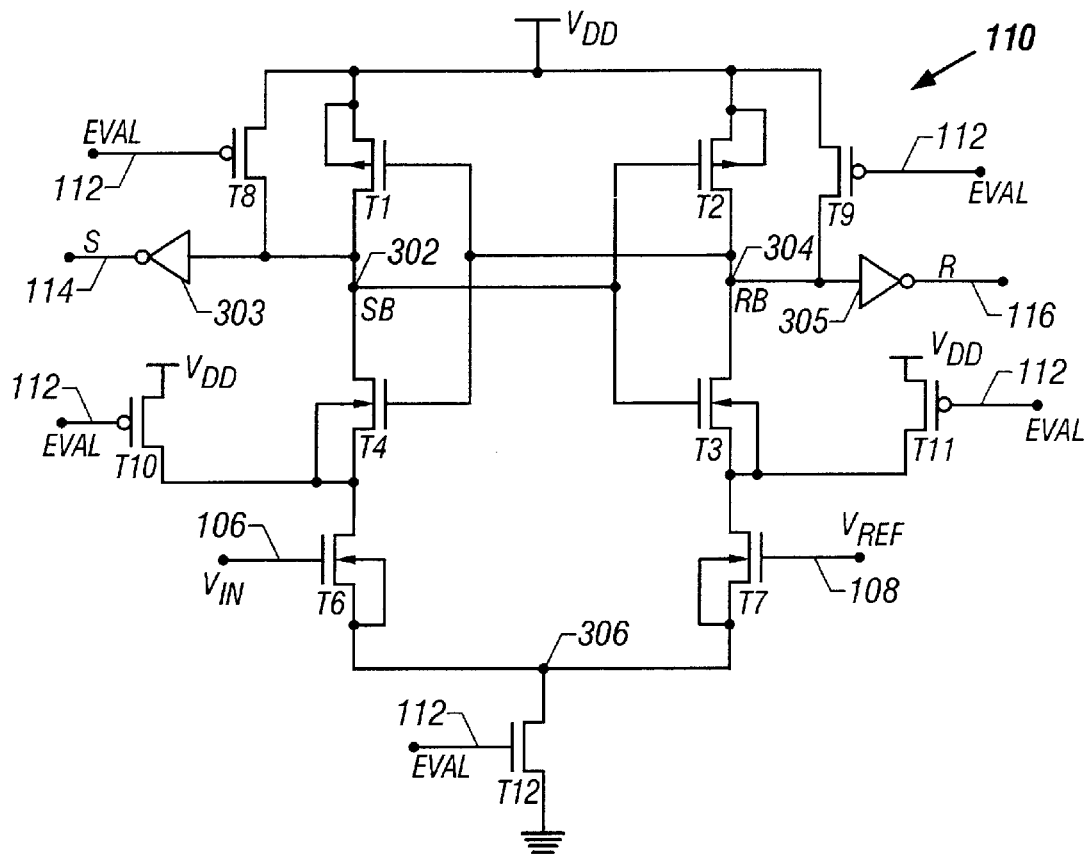
FIG. 3 depicts a circuit diagram of the exemplary sense amp circuit for use with the arrangement shown in FIG. 1.

Referring now to FIG. 3, depicted therein is a circuit diagram of an exemplary sense amp, e.g., SA 110, for use with the SAL circuit arrangement shown in FIG. 1. Two PMOS transistors T1 and T2, and two NMOS transistors T3 and T4 are arranged together as a pair of cross-coupled inverters, wherein nodes SB 302 and RB 304 refer to a pair of complementary data nodes formed therein. Transistors T8/T10 and T9/T11, each device being switched on or off by EVAL 112, are provided for pre-charging and balancing the data nodes 302 and 304, respectively, during the equilibration phase. Inverters 303 and 305 are operable to invert the logic levels of the data nodes so as to generate a pair of complementary data signals, S 114 and R 116, respectively. The input data signal (VIN) 106 and the reference signal (VREF) 108 are gated to NMOS devices T6 and T7, respectively. Node 306 is operable to be driven low when EVAL 112 turns transistor T12 on during the evaluation phase.

Figure 4:
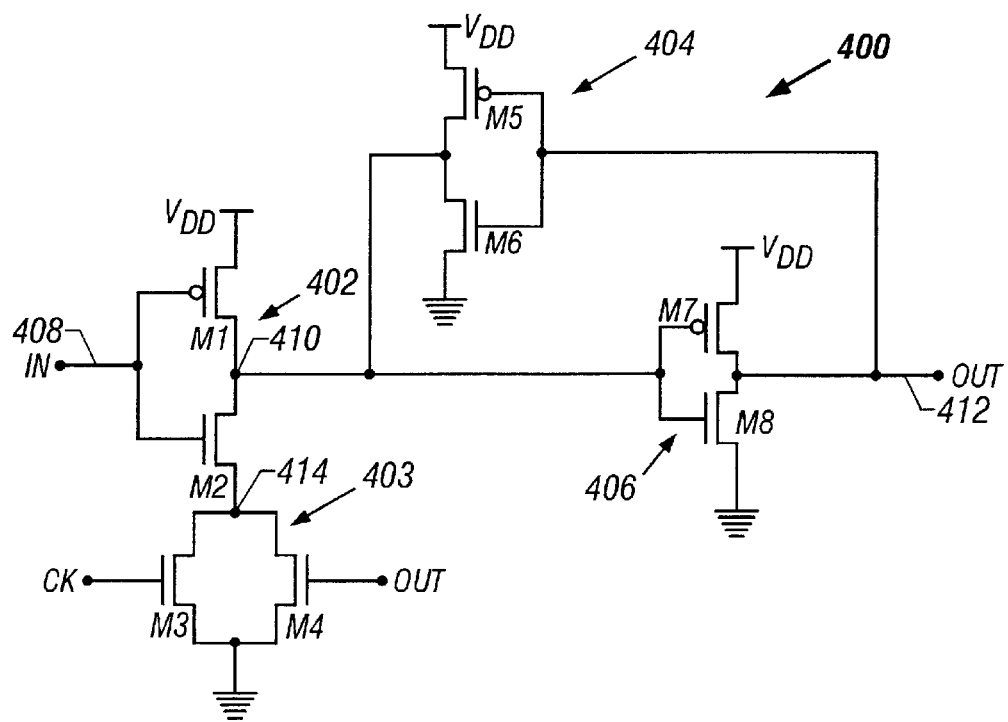
FIG. 4 depicts an exemplary dynamic latch circuit for capturing high-to-low transitions, which dynamic latch circuit may be advantageously used in the feedback circuit of FIGS. 5A–5D depict a plurality of timing diagram panels that illustrate the various signals used for effectuating the dual edge-triggered operation of the present invention's sense amp latch arrangement.
Figure 5A:
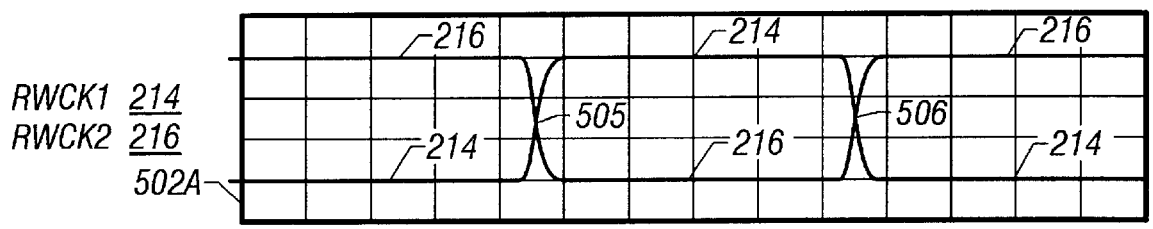
Figure 5B:
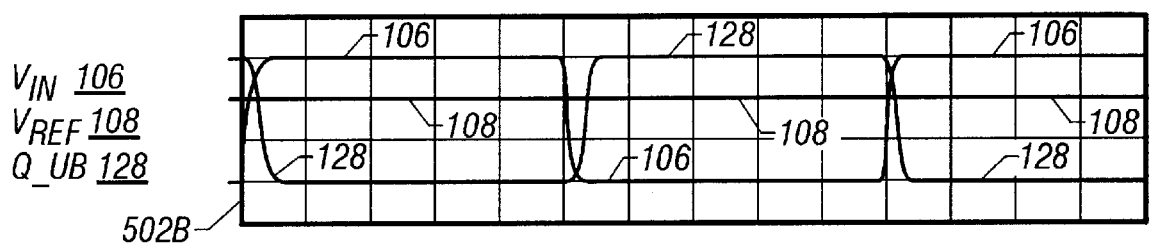
Figure 5C:
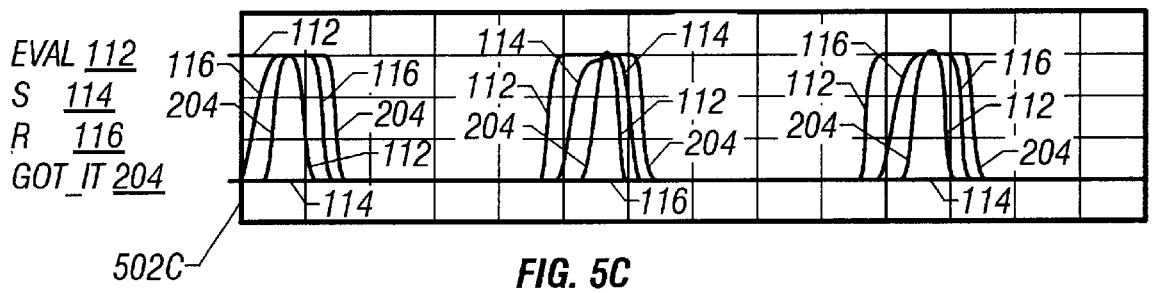
Figure 5D:
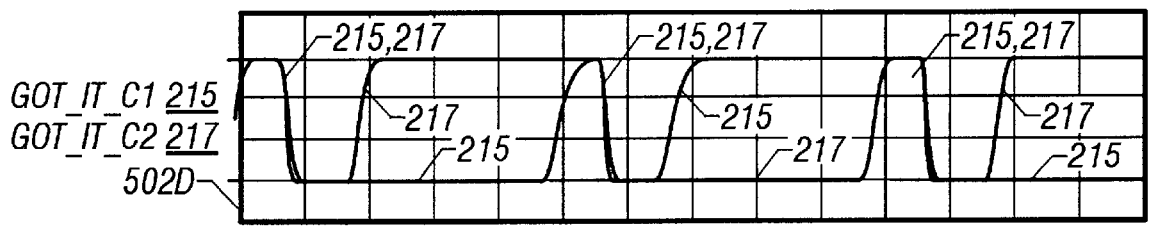

FIG. 4 depicts an exemplary dynamic latch circuit 400 for capturing high-to-low transitions, which dynamic latch circuit may be advantageously used as a zero catcher in the exemplary feedback circuit 200 shown in FIG. 2. Preferably, the dynamic latch 400 is comprised of a circuit arrangement with three inverters 402, 404 and 406 that provides for noise-resistant capture of a high-to-low transition on an input signal 408 when a CK signal is in a logic low state. Transistors M1 and M2 are operable to form the inverter 402 whose output 410 is provided as an input to the inverter 406 comprising transistors M7 and M8. The inverter 404, which comprises transistors M5 and M6, is cross-coupled to the inverter 406, wherein node 412 is operable to provide the output signal. Transistors M3 and M4 operate as pull-down devices to drive an internal node 414 low when they are turned on. When the input signal 408 and CK 409 are high, node 410 is driven low, which is quickly propagated as a logic high on the output 412 due to the regenerative feedback relationship of the inverters 404 and 406. When CK 409 is low, a high-to-low transition on the input signal 408 drives node 410 high, that appears as a logic low on the output 412.

In light of the foregoing detailed description of the data receiver interface circuitry and its constituent circuit portions, the general operation of the present invention will now be set forth as follows by taking reference to FIGS. 1–4 as necessary. Initially, the data interface circuitry 100 is at rest, where turbo=1, RWCK1=0, RWCK2=1, GOT_IT_C1=0, GOT_IT_C2=1, and EVAL=0. At this point, SA 110 (FIG. 3) is in equilibration phase where all internal nodes of the SA are in a balanced state and SB and RB nodes are pre-charged. Thus, the data signals S and R are driven low, which implies that their inverted signals S_L and R_L are driven high (i.e., [1,1] state).

Upon the clock transition RWCK1=1 and RWCK2=0 (i.e., the first clock is in phase), EVAL 112 is driven high which causes the SA to enter its evaluation phase. When data input VIN is at a higher voltage than VREF, SB node 302 in SA 110 is preferentially driven low because the pull-down device T12 is on. Regenerative feedback (i.e., positive feedback) within the SA ensures that the complementary RB node 304 is quickly driven to a logic high state. As a result, data signal (S) 114 goes high while its complementary signal (R) remains low.

With S=1 and R=0, SRLAT 122 transitions into a SET state. This results in Q_UB 128 transitioning into a logic high state while its complement (QB_UB) 130 goes low. In the meantime, the inverted data signals (S_L and R_L) transition from the [1,1] state into a [0,1] state, which is detected by the XOR gate 202 (FIG. 2). Subsequently, GOT_IT 204 is driven high, which then is inverted by inverter 206 to drive NGI_U 208 to a logic low state.

As NGI_U 208 transitions from 1 to 0, it triggers the zero catcher circuit DLAT_R2 212 (because RWCK2 is low), driving GOT_IT_C2 217 to a logic low state. This logic low is propagated through MUX 220, resulting in EVAL 112 being pulled low. In response, the evaluation phase of the SA is shut down and the equilibration operation ensues thereafter. Accordingly, those skilled in the art should appreciate that a self-timed loop is effectuated for bringing the SA out of its evaluation phase as the data sensing operation is substantially completed upon the occurrence of a rising clock edge. Further, because the SA is allowed to spend only a minimal amount of time (necessary to drive the data nodes to appropriate logic levels) in its imbalanced evaluation phase, device mismatching due to accumulated body bias in the SOI devices is advantageously reduced.

Once the SA is brought into its equilibration phase following the evaluation phase (because of the EVAL control signal 112 driven low by the self-timed feedback loop circuitry), the internal SB and RB nodes are pulled high due to pre-charging. Both S and R data signals 114,116 are driven low, which drives the SR latch 122 into a HOLD state. Substantially at the same time, the inverted S_L and R_L signals 124,126 transition into a [1,1] state, resulting in GOT_IT 204 being driven low. Consequently, the NGI_U signal 208 is driven high.

Since the clock input (i.e., RWCK2) to the zero catcher circuit (DLAT_R2) 212 is still low, GOT_IT_C2 217 remains in logic 0 condition, thereby ensuring that EVAL 122 is continuously held low. Thus, with both NGI_U 208 and RWCK1 214 being high, GOT_IT_C1 215 is driven high in preparation for the next clock transition (i.e., in RWCK2 216).

Upon the clock transition, whereby RWCK2 transitions into a logic high state (i.e., the clock is in phase) and RWCK1 transitions into a logic low state (out of phase), the SAL circuit portion repeats the same steps of data sensing in its evaluation phase as set forth above. Correspondingly, the S_L and R_L inputs to the feedback circuitry change to a [1,0] or [0,1] state (depending on the next data value being sensed), which transition is propagated therethrough to shut down the evaluation phase and thereby commence the next equilibration phase. The DLAT_R1 zero catcher circuit 210 is activated in this clock phase and, accordingly, the roles of GOT_IT_C1 215 and GOT_IT_C2 217 are reversed. As alluded to hereinabove, if the dual edge-triggered operation is not desired, the turbo signal 218 can be tied low, thereby keeping the SA in the equilibration phase throughout the clock phase where RWCK1=0 and RWCK2=1.

Referring now to FIGS. 5A–5D, depicted therein are a plurality of timing drawing panels that illustrate waveforms of the various signals used for effectuating the dual edge-triggered operation of the SAL arrangement of the present invention. It should be recognized by those skilled in the art that the timing relationships shown for the signals are essentially graphical renditions of the relationships described in detail hereinabove. Accordingly, only some of the salient features relating to the signals are particularly set forth immediately below.

Panel 502A depicts the two complementary clock signals, RWCK1 214 and RWCK2, where each clock is in phase (i.e., in a logic high state) for half of the cycle. Panel 502B depicts the relationship among VIN 106, VREF 108 and Q_UB 128. Panel 502C depicts EVAL 112, complementary S and R data signals 114 and 116, and GOT_IT signal 204. With particular reference to the clock crossover 505, where RWCK1 becomes 1 and RWCK2 becomes 0, as EVAL 112 goes high, the complementary S and R data signals are pulled apart (S being driven high and R being driven low), because VIN is greater than VREF. The GOT IT signal 204, which captures the transition in the S_L and R_L signals by means of the XOR gate, is driven high thereafter. Although VIN 106 is driven low shortly thereafter, the receiver circuitry is fast enough to latch the correct data. The EVAL signal 112 is then pulled low to shut down the evaluation phase. While RWCK1 214 is still high, the SA enters the equilibration phase for the remainder of the clock phase.

Similarly, with respect to the clock crossover 506, where VIN<VREF and RWCK2 is driven high, EVAL 112 is driven high which results now in R signal 116 being pulled to a logic high state and its complementary S signal 114 being pulled to ground. Panel 502D depicts the relationship between the zero catcher outputs, GOT_IT_C1 215 and GOT_IT_C2 217, that control the logic state of the EVAL signal 112 during the self-timed feedback loop operation for shutting off the evaluation phase.

Figure 6:
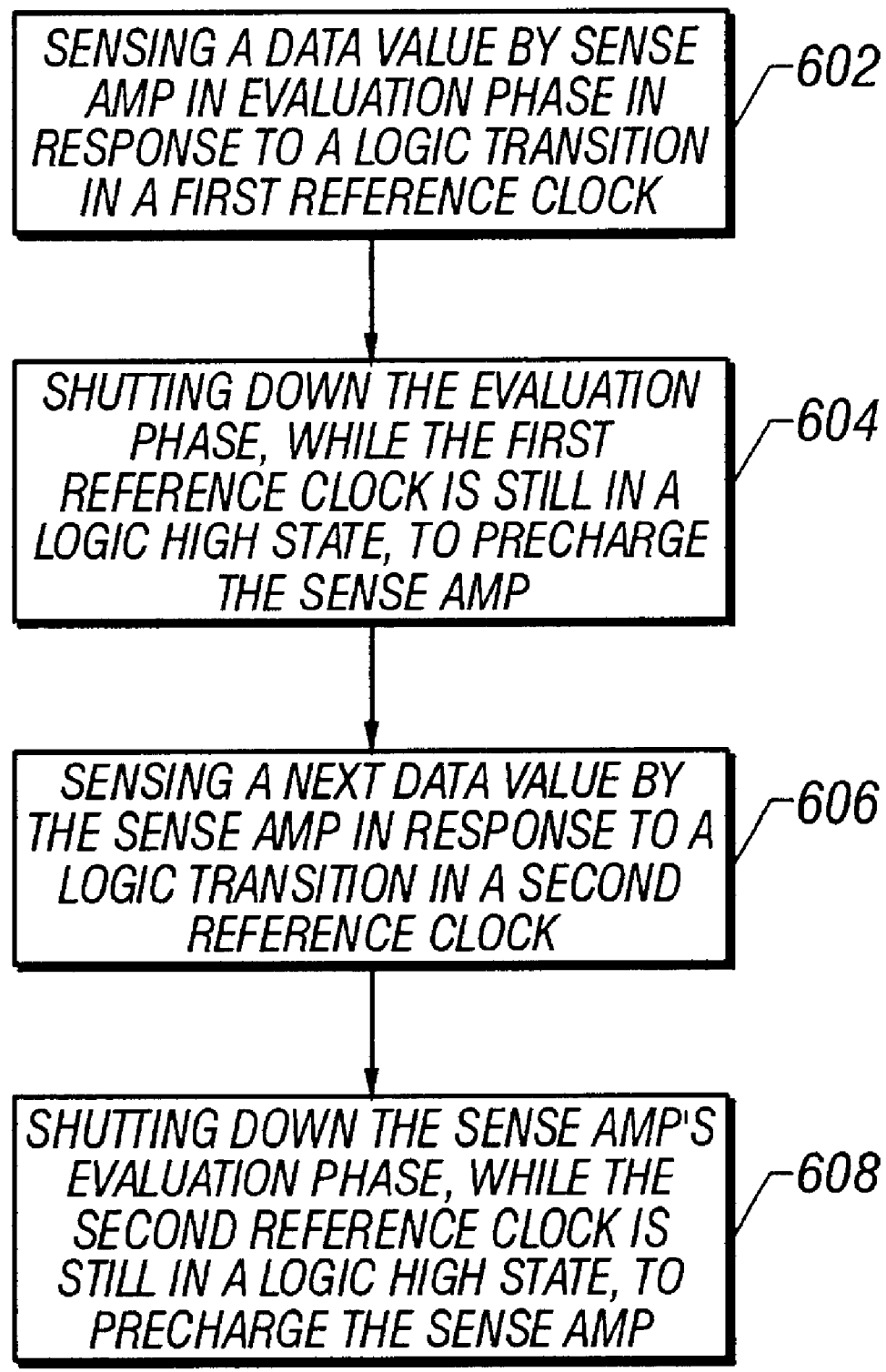
FIG. 6 is a flow chart of the various steps involved in the dual edge-triggered data receive operation method of the present invention.

FIG. 6 is a flow chart of the various steps involved in the dual edge-triggered data reception method of the present invention. Upon sensing a data value by a sense amp in its evaluation phase in response to a logic transition in a first reference clock (step 602), a self-timed feedback loop path is employed for shutting down the evaluation phase while the first clock is still in the transitioned state (e.g., logic high state) (step 604). Upon shutting down the evaluation phase, the SA enters an equilibration phase for pre-charging its internal nodes. Thereafter, a next data value is sensed when a logic transition is encountered in a second reference clock (step 606). The self-timed feedback loop path is operable to detect substantial completion of the data sense operation in the second clock phase, whereupon the SA's evaluation phase is shut down again while the second clock is still in the transitioned state (i.e., logic high state).

Based upon the foregoing Detailed Description, it should be readily apparent that the present invention provides an innovative solution for mitigating the body bias effect in SOI-based circuitry without the deficiencies and shortcomings of the state-of-the-art techniques. Accordingly, by practicing the teachings of the present invention, the advantageous features of SOI technology can be implemented in today's VLSI circuitry with reduced performance-debilitating "side effects". Furthermore, the present invention allows a data sensing application to make use of two rising edges in each clock cycle, thereby achieving increased throughput ("double duty" performance) without requiring replication for the sense amp circuits.

It is believed that the operation and construction of the present invention will be apparent from the foregoing Detailed Description. While the embodiments of the circuitry, apparatus and method of the present invention shown and described have been characterized as being preferred, it should be readily understood that various changes and modifications could be made therein (e.g., in the implementation of various logic gates and generation of the clock signals necessary to achieve the functionality of the self-timed shut down mechanism set forth above, or regarding the type of SOI process used or the particular design application, et cetera) without departing from the scope of the present invention as set forth in the following claims.

What is claimed is:

1. A data operation method, comprising the steps:
   sensing a data value by a sense amplifier (sense amp) in its evaluation phase responsive to a logic transition in a first clock;
   shutting down said sense amp's evaluation phase so as to enter into an equilibration phase while said first clock is still in a transitioned state;
   sensing a next data value by said sense amp in response to a logic transition in a second clock; and
   shutting down said sense amp's evaluation phase so as to enter into a next equilibration phase while said second clock is still in a transitioned state.

2. The data operation method as set forth in claim 1, further comprising a data latching step after said sensing steps by said sense amp.

3. The data operation method as set forth in claim 1, wherein said logic transition in said first clock comprises a low-to-high transition.

4. The data operation method as set forth in claim 1, wherein said logic transition in said second clock comprises a low-to-high transition.

5. The data operation method as set forth in claim 1, wherein said first and secondary clocks are complementary with respect to each other.

6. The data operation method as set forth in claim 1, wherein said data value and said next data value are provided by an off-chip data circuit.

7. The data operation method as set forth in claim 1, wherein said data value and said next data value are provided by an on-chip memory array.

8. The data operation method as set forth in claim 1, wherein said sense amp's evaluation phase is shut down by a feedback mechanism operating responsive to a pair of complementary data signals generated by said sense amp.

9. The data operation method as set forth in claim 1, wherein said sensing steps are performed by a sense amp comprising a plurality of silicon-on-insulator (SOI) transistors.

10. Data interface circuitry, comprising:
    a sense amplifier (sense amp) latch circuit portion including a sense amp operable to sense data and a latch operable to hold said data, said sense amp operating to generate a pair of complementary data signals responsive, at least in part, to a control signal operable to alternate said sense amp's operation between an evaluation phase and a equilibration phase; and
    a feedback circuit portion operating responsive, at least in part, to said pair of complementary data signals and a pair of complementary clock signals, said feedback circuit portion for effectuating a self-timed loop for shutting down said sense amp's evaluation phase upon substantially completing a data sense operation.

11. The data interface circuitry as set forth in claim 10, further comprising a buffer stage for buffering said complementary data signals before forwarding them to an on-chip circuit.

12. The data interface circuitry as set forth in claim 10, wherein said latch comprises a set-reset (S-R) latch.

13. The data interface circuitry as set forth in claim 12, wherein said sense amp latch circuit portion includes a pair of inverters for generating a pair of inverted data signals from said pair of complementary data signals.

14. The data interface circuitry as set forth in claim 13, wherein said feedback circuit portion comprises:
    an exclusive-OR (XOR) gate operating responsive to said pair of inverted data signals;
    an inverter coupled to said XOR gate's output;
    a pair of zero catcher circuits coupled to said inverter's output, wherein each zero catcher circuit is operable to detect a high-to-low transition in said inverter's output that signifies a substantial completion of said sense amp's data sensing operation in a particular clock phase; and
    a multiplexer for propagating a logic low state to said control signal when one of said zero catcher circuits generates a logic low in said particular clock phase.

15. The data interface circuitry as set forth in claim 14, further comprising means to disable propagation of a logic low state from one of said zero catcher circuits.

16. The data interface circuitry as set forth in claim 10, wherein said sense amp latch circuit portion and said feedback circuit portion are comprised of silicon-on-insulator (SOI) devices.

17. The data interface circuitry as set forth in claim 10, wherein said data is generated by an off-chip data circuit.

18. The data interface circuitry as set forth in claim 17, further comprising an electrostatic discharge (ESD) protection block coupled to said sense amp latch circuit portion.

19. The data interface circuitry as set forth in claim 10, wherein said data is generated by an on-chip memory element.

20. An apparatus for mitigating the history effect in a silicon on-insulator (SOI)-based data receiver interface circuit, comprising:

sensing means for sensing data provided by an off-chip data circuit, said means operating responsive to a control signal's logic state; and feedback means for modifying said control signal's logic state upon substantially completing a data sensing operation by said sensing means.

21. The apparatus as set forth in claim 20, wherein said feedback means includes a pair of zero catcher circuits for detecting a high-to-low transition that signifies a substantial completion of said data sensing operation in a particular clock phase associated with one of two complementary clock signals.

22. The apparatus as set forth in claim 20, wherein said feedback means comprises a self-timed feedback loop operable in response to a pair of complementary data signals provided by said sensing means.

\* \* \* \* \*